United States Patent [19]
Baum

[11] 3,990,002
[45] Nov. 2, 1976

[54] METHOD AND APPARATUS FOR TESTING TELEVISION YOKES AND FLYBACK WINDINGS

[75] Inventor: Robert E. Baum, Dell Rapids, S. Dak.

[73] Assignee: Sencore, Inc., Sioux Falls, S. Dak.

[22] Filed: May 7, 1975

[21] Appl. No.: 575,196

[52] U.S. Cl. ................................. 324/51; 324/54
[51] Int. Cl.² ................... G01R 31/02; G01R 31/06
[58] Field of Search ............... 324/51, 54, 55, 57 Q

[56] References Cited
UNITED STATES PATENTS

| | | | |
|---|---|---|---|
| 2,249,157 | 7/1941 | Morgan et al. | 324/55 |
| 2,990,514 | 6/1961 | Johnson | 324/55 |
| 3,163,818 | 12/1964 | Spaven | 324/57 Q |
| 3,287,635 | 11/1966 | Mole | 324/54 |
| 3,354,387 | 11/1967 | Whaley et al. | 324/55 |
| 3,508,143 | 4/1970 | Kuroda | 324/54 |
| 3,731,185 | 5/1973 | Pittman | 324/54 |
| 3,887,867 | 6/1975 | Safer et al. | 324/54 X |

*Primary Examiner*—Gerard R. Strecker
*Attorney, Agent, or Firm*—Edmond T. Patnaude

[57] ABSTRACT

A plurality of capacitors are successively connected across a coil while a train of driving pulses is applied thereto to cause the coil to ring after each driving pulse, and the number of cycles which occur in the ringing signal between two voltage levels thereof are counted to indicate if the coil is defective.

6 Claims, 1 Drawing Figure

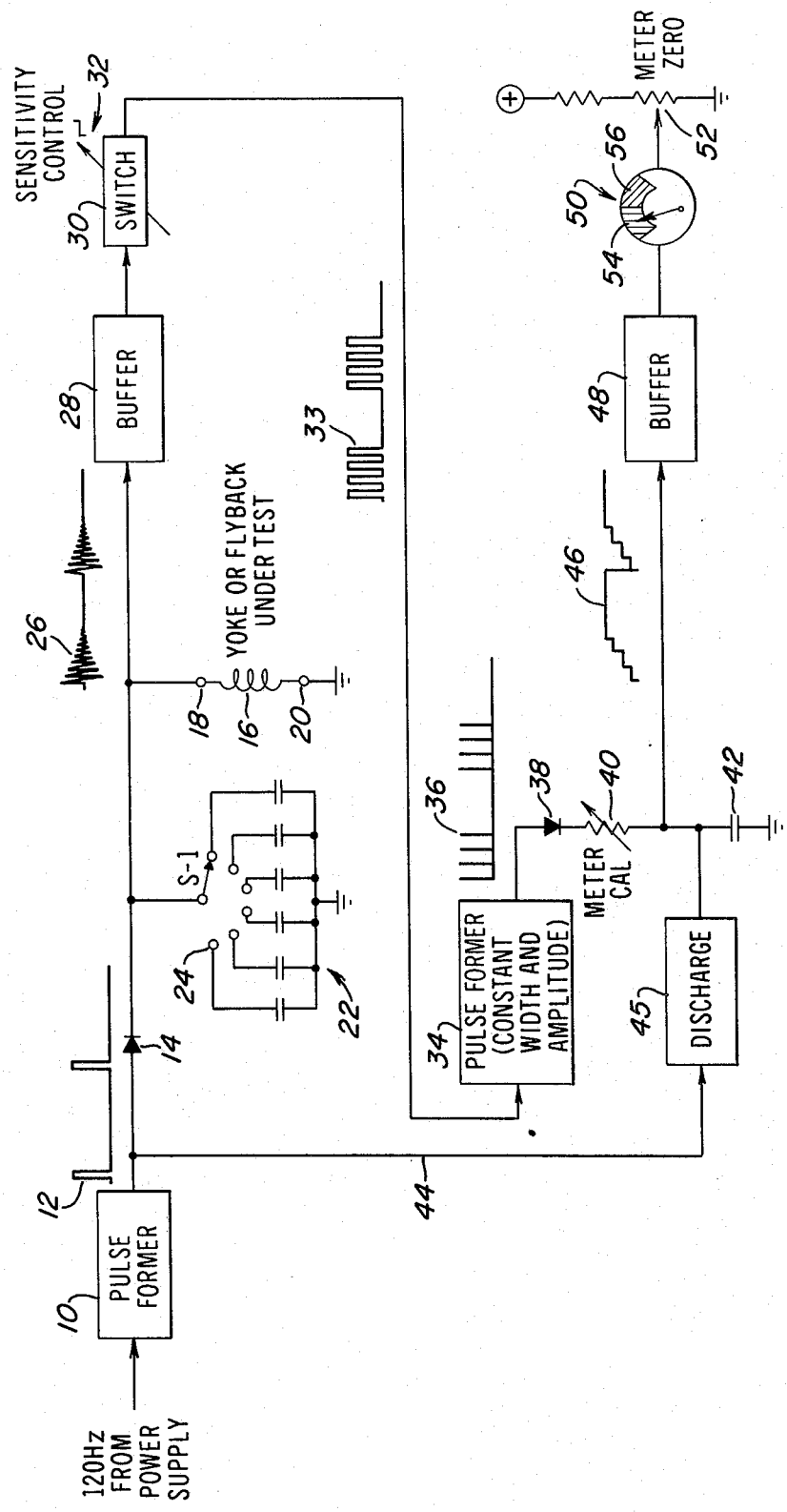

METHOD AND APPARATUS FOR TESTING TELEVISION YOKES AND FLYBACK WINDINGS

The present invention relates in general to the art of testing inductance coils, and it relates more particularly to a novel method and apparatus wherein a coil under test is caused to ring and the cycles in the ringing signal between two peak voltage levels thereof are counted to indicate if the coil is satisfactory.

BACKGROUND OF THE INVENTION

There is at the present time a need for a small portable field instrument for testing the yoke and flyback transformers of solid state television receivers. In order to locate the cause of a problem in the sweep circuits of a television receiver it was common to substitute a coil of a test instrument for the yoke of the receiver and then to measure the amount of power delivered to the substitute coil. If the substitute coil corrected the problem it was apparent that the yoke was defective. This method is not satisfactory for use with solid state television receivers because of the difficulty of providing a universal substitute yoke which will not overload the sweep circuits.

One method which has been reliably used to test yoke coils and transformer windings is a ringing test. With this testing method a narrow voltage pulse is applied to the coil to cause it to ring, i.e., resonate and produce a dampened sine wave. By analyzing the dampened sine wave as displayed on an oscilloscope it can be determined whether the coil is defective. This is, however, a sophisticated test which requires a highly skilled operator since minor adjustments of the oscilloscope can cause a good coil to appear defective and vice versa. Another disadvantage of this test is the fact that it requires an oscilloscope and is thus not suitable for field use.

SUMMARY OF THE INVENTION

Briefly, there is provided in accordance with the teachings of the present invention a circuit and method for testing inductance coils such as yokes and the windings of flyback transformers by causing the coils to ring and then counting the number of ringing cycles occurring between two peak voltage levels of the ringing signal. When using this circuit and method to test a television yoke, a plurality of capacitors are successively connected in parallel with the coil under test while a train of driving pulses is applied thereto. The dampened sine waves which occur after each driving pulse are squared and shaped and then used to charge a capacitor whose maximum voltage is displayed on a meter to indicate if the coil is defective.

BRIEF DESCRIPTION OF THE DRAWING

Further objects and advantages and a better understanding of the present invention can be had by reference to the following detailed description wherein the single FIGURE is a block diagram of a circuit for carrying out the method of the present invention for testing coils.

DETAILED DESCRIPTION OF THE INVENTION

With reference to the drawing, a pulse former 10 is supplied with a 120 Hz signal suitably derived from a full wave rectifier type power supply and produces a train of narrow voltage pulses 12 at a rate of 120 Hz. These pulses are coupled through a blocking diode 14 and across a coil under test identified by the number 16. The coil 16 is connected between a pair of terminals 18 and 20, terminal 20 being connected to ground and terminal 18 being connected to the diode 14. A plurality of capacitors 22 are respectively connected between ground and a plurality of switch contacts 24 of a rotary selector switch S1 whose wiper is connected to the terminal 18. When each of the driving pulses 12 is thus applied to the resonant circuit made up of the coil 16 and the particular capacitor 22 which is connected in parallel therewith, the coil 16 is caused to ring at a particular resonant frequency, i.e., a dampened sine wave of voltage as illustrated at 26 is developed between the terminal 18 and ground. The dampened sine wave 26 is then passed through a buffer 28 to prevent loading of the coil 16, and to a switch 30 which produces one square wave pulse for each complete cycle of the dampened sine wave (ringing signal) applied thereto.

The switch 30 includes a sensitivity control 32 which adjusts the lowest value of each input pulse for which the switch 30 produces a square wave output pulse. This value is preferably set at about 25% of the maximum peak value of the ringing signal 26 produced across a good coil. The groups of square wave pulses from the switch 30 are coupled to a pulse former 34 which shapes the squared pulses to provide pulses of constant width and amplitude as shown at 36. These pulses 36 which occur in groups at the ringing frequency of the coil with the number of pulses 36 in each group being equal to the number of ringing cycles which occurs between the start of the particular ring and the time when the peak value of the ringing signal has decreased to the preset value. The pulses 36 are coupled through a diode 38 and a variable resistor 40 to a capacitor 42. The capacitor 42 integrates the pulses 36 in each group since the voltage across the capacitor 42 increases proportionally with each pulse and the capacitor 42 is discharged each time that a drive pulse 12 occurs. For this later purpose the output of the pulse former 10 is coupled through a conductor 44 to a discharge circuit 45 which discharges the capacitor 42 in response to each driving pulse 12 and thus at the beginning of each ringing cycle. The voltage appearing across the capacitor 42 is thus a step wave as shown at 46 and is coupled through a buffer 48 to a peak reading volt meter 50. The meter reading is held during the discharge and recharging time and is preferably calibrated both in number of pulses or ringing cycles and by a scale division to indicate whether the coil is good or bad. It has been found that ten cycles or more indicates a satisfactory television yoke and less than 10 ringing cycles indicates a defective one. A conventional meter zeroing circuit including a potentiometer 52 is provided for setting the zero reading of the meter.

OPERATION

In use, the coil to be tested is connected between the terminals 18 and 20 whereby the 120 Hz train of driving pulses 12 is applied thereto. The switch S1 is then operated to selectively connect the capacitors 22 in parallel with the coil 16. Each capacitor will cause the coil 16 to ring at a different frequency. It has been found that for use with yoke and flyback transformer testing these capacitors preferably have a value ranging from 0.01 micro farad to 47 pico farads. As the capacitance value is changed and the frequency at which the coil under test rings changes, the meter will indicate the maximum voltage developed across the capacitor 42.

If, with any one of the capacitance values the ringing signal has 10 cycles between the initial driving voltage pulse and the time when the peak voltage has decayed to the preset value, the meter will present a reading indicating that the coil under test is good. If the meter reading is such that 10 ringing cycles are not counted with any of the capacitors 22 connected across the coil 16, it is known that the coil is defective. Preferably the meter dial has a red area 54 indicating a defective coil and a green area 56 indicating a good coil.

Switch S1 is illustrated as a rotary selector switch but it will be apparent that a plurality of push button switches may be used to selectively connect the capacitors 22 in parallel with the coil under test.

While the present invention has been described in connection with the particular embodiments thereof, it will be understood by those skilled in the art that many changes and modifications may be made without departing from the true spirit and scope of the present invention. Therefore, it is intended by the appended claims to cover all such changes and modifications which come within the true spirit and scope of this invention.

What is claimed is:

1. An instrument for testing television yokes and the windings of flyback transformers, comprising
    a plurality of capacitors having different values of capacitance,
    means for selectively connecting said capacitors in parallel with said coil,
    a source of a train of voltage pulses,
    means for connecting said source of voltage pulses to said yokes or windings to cause said yokes or windings to ring and produce dampened sine waves of voltage thereacross while each of said capacitors is respectively connected in parallel therewith,
    means for counting the number of cycles occurring in each of said dampened sine waves between two predetermined voltage values thereof, and
    means for indicating if the maximum number of cycles counted in said dampened sine waves exceeds a predetermined value with each value of capacitance connected across said yoke or winding.

2. An instrument according to claim 1 wherein said means for counting comprises,
    means for producing a square wave voltage pulse of predetermined value and time duration for each of said cycles, and
    means for integrating the said square wave voltage pulses occurring after each driving pulse.

3. An instrument according to claim 2 wherein said means for integrating comprises a capacitor, and
    said means for indicating comprises a voltmeter indicating the peak voltage developed across said capacitor.

4. An instrument according to claim 1 wherein one of said voltage values is the voltage of said driving pulses, comprising
    means for adjusting the other of said voltage values.

5. A method of testing television yokes and the windings of flyback transformers, comprising the steps of
    applying a train of DC voltage pulses across a yoke or flyback transformer winding to be tested,
    selectively connecting a plurality of different values of capacitance across said yoke or winding while said train of DC voltage pulses is applied thereto,
    continuously counting the number of ringing cycles of at least a predetermined amplitude occurring in said yoke or winding after each voltage pulse is applied thereto during the connection of each said different value of capacitance thereacross, and
    providing an indication as to whether any number thus counted exceeds a predetermined value for each value of capacitance connected across said yoke or winding.

6. A method of testing according to claim 5 wherein said step of continuously counting comprises the further steps of
    generating a train of equal width, equal amplitude DC voltage pulses equal in number to said cycles to be counted,
    integrating said train of voltage pulses, and
    applying the resulting integral to a display device.

* * * * *